(12) United States Patent
Hara

(10) Patent No.: US 8,827,430 B2
(45) Date of Patent: Sep. 9, 2014

(54) PIEZOELECTRIC ELEMENT, LIQUID EJECTING HEAD, AND LIQUID EJECTING APPARATUS

(75) Inventor: Toshiki Hara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 807 days.

(21) Appl. No.: 12/889,258

(22) Filed: Sep. 23, 2010

(65) Prior Publication Data

US 2011/0074889 A1 Mar. 31, 2011

(30) Foreign Application Priority Data

Sep. 30, 2009 (JP) ................................ 2009-227132

(51) Int. Cl.
| | |
|---|---|
| B41J 2/045 | (2006.01) |
| C04B 35/499 | (2006.01) |
| B41J 2/14 | (2006.01) |
| H01L 41/43 | (2013.01) |
| H01L 41/09 | (2006.01) |
| H01L 41/187 | (2006.01) |
| H01L 41/314 | (2013.01) |

(52) U.S. Cl.
CPC ........... B41J 2/14233 (2013.01); C04B 35/499 (2013.01); *B41J 2202/03* (2013.01); H01L 41/43 (2013.01); H01L 41/0973 (2013.01); H01L 41/1876 (2013.01); H01L 41/314 (2013.01)
USPC ..................................... 347/72; 252/62.9 PZ

(58) Field of Classification Search
CPC ............. B41J 2202/03; H01L 41/1876; C04B 35/499; C04B 2235/768
USPC .......................... 347/67, 71, 72; 252/62.9 PZ
See application file for complete search history.

(56) References Cited

U.S. PATENT DOCUMENTS 6,398,349 B1 6/2002 Murai
7,766,464 B2 * 8/2010 Noguchi et al. ................. 347/72

FOREIGN PATENT DOCUMENTS

WO 99/45598 9/1999

OTHER PUBLICATIONS

Zheng Wu and Michael Sayer "Defect Structures and Fatigue in Ferroelectric PZY Thin Films" Proceedings of the Eighth IEEE International Symposium on Applications of Ferroelectrics, 1992. ISAF '92., Aug. 30-Sep. 2, 1992 Location: Greenville, SC, on pp. 244-247.

* cited by examiner

*Primary Examiner* — Jerry Rahll
(74) *Attorney, Agent, or Firm* — Workman Nydegger

(57) ABSTRACT

A piezoelectric element includes a first conductive layer, a piezoelectric layer, and a second conductive layer. The piezoelectric layer is composed of a compound oxide containing at least lead, zirconium, titanium, and oxygen, and the compound oxide has a perovskite crystal structure. The piezoelectric layer has a thermally stimulated current having at least two peaks including a low temperature-side peak and a high temperature-side peak, and the magnitude of the low temperature-side peak is 1/30 or less of that of the high temperature-side peak.

9 Claims, 7 Drawing Sheets

PIEZOELECTRIC ELEMENT, LIQUID EJECTING HEAD, AND LIQUID EJECTING APPARATUS

CROSS-REFERENCE TO RELATED APPLICATIONS

This application claims the benefit of priority to Japanese Patent Application No. 2009-227132 filed Sep. 30, 2009, the contents of which are hereby incorporated by reference in their entirety.

BACKGROUND

1. Technical Field

The present invention relates to a piezoelectric element, a liquid ejecting head, and a liquid ejecting apparatus.

2. Related Art

Piezoelectric actuators are used in liquid ejecting heads and the like. A typical example of the piezoelectric actuators used for liquid ejecting heads is one driven in a flexural vibration mode.

An example of the liquid ejecting heads is an ink jet recording head or the like including a vibrating plate which constitutes a portion of a pressure-generating chamber communicated with a nozzle orifice which ejects ink droplets so that the vibrating plate is deformed by a piezoelectric element to apply pressure to ink introduced into the pressure-generating chamber, ejecting ink droplets from the nozzle orifice. The piezoelectric actuator provided on the ink jet recording head is formed by, for example, forming a uniform piezoelectric material layer over the entire surface of the vibrating plate and cutting the piezoelectric material layer in a shape corresponding to the pressure-generating chamber by lithography so that the actuator can be driven independently for each pressure-generating chamber.

A piezoelectric element representative of the piezoelectric actuators is formed by depositing in order an adhesive layer, a platinum layer, and an anti-diffusion layer to form a lower electrode on a silicon single-crystal substrate, forming a piezoelectric precursor film composed of a piezoelectric material and firing the film to form a piezoelectric layer including a crystallized piezoelectric film, and depositing an upper electrode (refer to, for example, WO99/45598 (pages 19 to 23, FIGS. 12 to 14).

The performance of a piezoelectric element depends on the performance of a piezoelectric material of a piezoelectric layer. For example, when the piezoelectric material is a compound oxide such as lead zirconate titanate or the like, the durability, leak current characteristics, displacement characteristics, and the like of the piezoelectric element may be controlled by the quality and amount of detects present in crystals of the compound oxide. In addition, it has been found that oxygen atoms tend to separate (oxygen defect) from their original positions in crystals, move toward electrodes which hold the piezoelectric layer therebetween, and accumulate. Further, such oxygen defects may accelerate the formation of lead defects, thereby causing PbO defects. Therefore, when the piezoelectric element having crystal defects is used for a liquid ejecting head of the like, the operation of the piezoelectric element may change with time, causing the problem of changing conditions for ejecting a liquid.

The inventors have found that a relative amount of some specified defects among various defects produced in a piezoelectric layer easily affects the performance of the piezoelectric element. The present invention has been achieved on the basis of this finding.

SUMMARY

An advantage of some aspects of the invention is that the invention provides a piezoelectric element excellent in durability.

The invention has been achieved for resolving at least part of the above-mentioned problem and can be realized as embodiments or application examples described below.

Application Example 1

A piezoelectric element according to an embodiment of the present invention includes a first conductive layer, a second conductive layer disposed to face the first conductive layer, and a piezoelectric layer disposed between the first conductive layer and the second conductive layer. The piezoelectric layer is composed of a compound oxide containing at least lead, zirconium, titanium, and oxygen, and the compound oxide has a perovskite crystal structure. In addition, the piezoelectric layer has a thermally stimulated current having two peaks including a low temperature-side peak and a high temperature-side peak, and the magnitude of the low temperature-side peak is $1/30$ or less of the high temperature-side peak.

This piezoelectric element exhibits a good quantitative ratio between a defect type which produces the low temperature-side peak and a defect type which produces the high temperature-side peak in measurement of the thermally stimulated current. Therefore, a leak current is suppressed over a long time, and a decrease in displacement is also suppressed. Consequently, the piezoelectric element of this application example is excellent in durability.

Application Example 2

In the piezoelectric element of application example 1, the compound oxide is lead zirconate titanate or lead zirconate titanate niobate.

This piezoelectric element has the advantage of a high efficiency of electro-mechanical conversion in addition to the advantage of application example 1.

Application Example 3

In the piezoelectric element of application example 1 or 2, the thickness of the piezoelectric layer is 100 nm or more and 2,000 nm or less.

This piezoelectric element can be driven at a low voltage and can form a small and thin actuator.

Application Example 4

A piezoelectric actuator according to an embodiment of the present invention includes the piezoelectric element described in any one of application examples 1 to 3, and a vibrating plate with flexibility which is provided in contact with the first conductive layer or the second conductive layer.

This piezoelectric actuator includes the piezoelectric element of any one of the above-described application examples and is thus excellent in durability.

Application Example 5

A liquid ejecting head according to an embodiment of the present invention includes the piezoelectric actuator described in application example 4, and a pressure chamber communicated with a nozzle orifice and changed in volume by an operation of the piezoelectric actuator.

This liquid ejecting head includes the piezoelectric actuator of the above-described application example and is thus excellent in durability.

Application Example 6

A liquid ejecting apparatus according to an embodiment of the present invention includes the liquid ejecting head described in application example 5.

This liquid ejecting apparatus includes the liquid ejecting head of the above-described application example and is thus excellent in durability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferred embodiment of the present invention is described with reference to the drawings. The embodiment described below is made for explaining an example of the present invention. In addition, the invention is not limited to the embodiment and includes various modified examples carried out within the scope of the gist.

1. Piezoelectric Element

Figure 1:
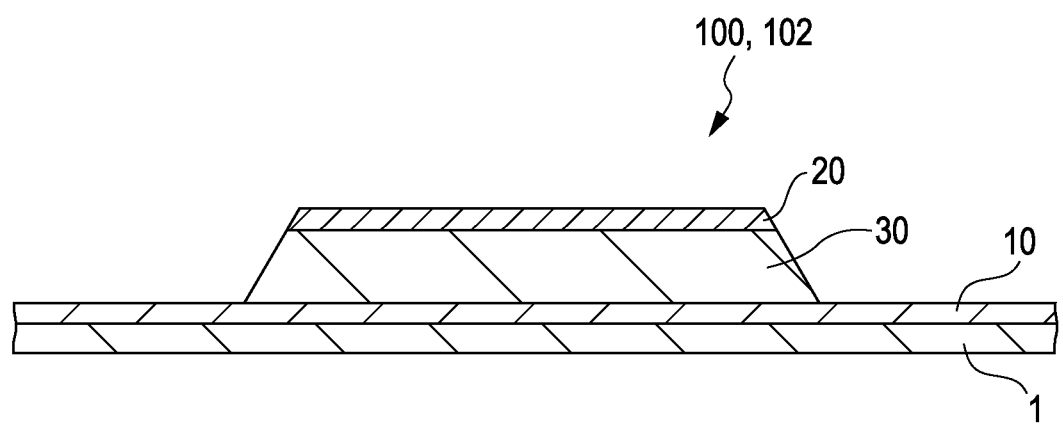
FIG. 1 is a schematic sectional view of a piezoelectric element according to an embodiment of the invention.

FIG. 1 is a schematic sectional view of a piezoelectric element 100 according to an embodiment of the invention.

The piezoelectric element 100 according to the embodiment includes a first conductive layer 10, a second conductive layer 20, and a piezoelectric layer 30.

1.1. First Conductive Layer

The first conductive layer 10 is formed on, for example, a substrate 1. The substrate 1 can be made of a flat plate composed of, for example, a conductor, a semiconductor, or an insulator. The substrate 1 may have a single-layer structure or a structure including a plurality of laminated layers. The internal structure of the substrate 1 is not limited as long as the top surface has a planar shape and, for example, a structure having a space formed therein may be used. For example, as in a liquid ejecting head described below, when a pressure chamber and the like are formed below the substrate 1, the substrate 1 and a plurality of members formed below the substrate 1 may be collectively regarded as one substrate 1.

The substrate 1 may be a vibrating plate with flexibility which can be deformed (bent) by an operation of the piezoelectric layer 30. In this case, the piezoelectric element 100 serves as a piezoelectric actuator 102 including the vibrating plate, the first conductive layer 10, the piezoelectric layer 30, and the second conductive layer 20. The expression "the substrate 1 with flexibility" represents that the substrate 1 can be bent. When the substrate 1 is the vibrating plate, bending of the substrate 1 which is enough to change the volume of the pressure chamber to the same extent as the volume of liquid to be ejected is sufficient for the piezoelectric actuator 102 to be used in a liquid ejecting head.

When the substrate 1 is the vibrating plate, the material of the substrate 1 can be exemplified by inorganic oxides such as zirconium oxide ($ZrO_2$), silicon nitride, silicon oxide, and the like, and alloys such as stainless steel and the like. Among these materials, zirconium oxide is particularly preferred for the material of the substrate 1 (vibrating plate) from the viewpoint of chemical stability and rigidity. In this case, the substrate 1 may have a laminated structure including two or more of the exemplified materials.

In this embodiment, the case in which the substrate 1 is the vibrating plate and is composed of zirconium oxide is described as an example. Therefore, the piezoelectric element 100 is substantially the same as the piezoelectric actuator 102 including the vibrating plate with flexibility which can be deformed (bent) by an operation of the piezoelectric layer 30. Therefore, in the description below, the piezoelectric element 100 and the piezoelectric actuator 102 can be replaced with each other.

The shape of the first conductive layer 10 is not limited as long as it can be opposed to the second conductive layer 20. However, when the piezoelectric element 100 includes a thin film, a layer or a thin film is preferred. In this case, the thickness of the first conductive layer 10 can be, for example, 50 nm or more and 300 nm or less. Also, the planar shape of the first conductive layer 10 is not particularly limited as long as the piezoelectric layer 30 can be disposed between the first conductive layer 10 and the second conductive layer 20 when both layers are opposed to each other. For example, a rectangular shape, a circular shape, or the like can be used.

One of the functions of the first conductive layer 10 is to serve as one (e.g., a lower electrode formed below the piezoelectric layer 30) of the electrodes used for applying a voltage to the piezoelectric layer 30. The first conductive layer 10 may be provided with the function to control crystal orientation when the piezoelectric layer 30 is crystallized.

The material of the first conductive layer 10 can be exemplified by various metals such as nickel, iridium, platinum, and the like; conductive oxides thereof (e.g., iridium oxide and the like); strontium-ruthenium compound oxides ($SrRuO_x$: SRO); lanthanum-nickel compound oxides ($LaNiO_x$: LNO); and the like. The first conductive layer 10 may have a single-layer structure using one of the exemplified materials or a laminated structure using two or more. In addition, for example, an adhesive layer or the like may be formed between the first conductive layer 10 and the substrate 1. In this case, for example, a titanium layer or the like can be used as the adhesive layer.

1.2. Second Conductive Layer

The second conductive layer 20 is disposed to face the first conductive layer 10. The second conductive layer 20 may be entirely or partially opposed to the first conductive layer 10. The shape of the second conductive layer 20 is not limited as long as it can be opposed to the first conductive layer 10. However, when the piezoelectric element 100 includes a thin film, a layer or a thin film is preferred. In this case, the thickness of the second conductive layer 20 can be, for example, 50 nm or more and 300 nm or less. Also, the planar shape of the second conductive layer 20 is not particularly limited as long as the piezoelectric layer 30 can be disposed between the first conductive layer 10 and the second conductive layer 20 when both layers are opposed to each other. For example, a rectangular shape, a circular shape, or the like can be used.

One of the functions of the second conductive layer 20 is to serve as one (e.g., an upper electrode formed on the piezoelectric layer 30) of the electrodes used for applying a voltage to the piezoelectric layer 30. The second conductive layer 20 may be provided with the function to control crystal orientation when the piezoelectric layer 30 is crystallized. The material of the second conductive layer 20 may be the same as the first conductive layer 10.

FIG. 1 shows an example in which the first conductive layer 10 is formed to have a larger planar size than the second conductive layer 20. However, the second conductive layer 20 may be formed to have a larger planar size than the first conductive layer 10. In this case, the second conductive layer 20 may be formed on the side surface of the piezoelectric layer 30 so that the second conductive layer 20 can also be provided with the function to protect the piezoelectric layer 30 from moisture, hydrogen, and the like.

1.3. Piezoelectric Layer

The piezoelectric layer 30 is disposed between the first conductive layer 10 and the second conductive layer 20. The piezoelectric layer 30 may be in contact with at least one of the first conductive layer 10 and the second conductive layer 20. In addition, another layer may be formed between the piezoelectric layer 30 and at least one of the first conductive layer 10 and the second conductive layer 20. In this case, examples of the other layer include an orientation control layer (e.g., a titanium layer) for controlling the crystal orientation of the piezoelectric layer 30 and the like.

In the example shown in FIG. 1, the piezoelectric layer 30 is provided in contact with the first conductive layer 10 and the second conductive layer 20. The thickness of the piezoelectric layer 30 can be, for example, 100 nm or more and 2000 nm or less. When the thickness of the piezoelectric layer 300 is out of this range, sufficient deformation (electro-mechanical conversion) may not be obtained.

In addition, the piezoelectric layer 30 contains a compound oxide containing at least lead, zirconium, titanium, and oxygen. Examples of the compound oxide contained in the piezoelectric layer 30 include oxides represented by the general formula $ABO_3$ (for example, A contains Pb, and B contains Zr and Ti). More specifically, lead zirconate titanate (Pb(Zr, Ti)$O_3$) (may be abbreviated as "PZT" hereinafter), lead zirconate titanate niobate (Pb(Zr, Ti, Nb)$O_3$) (may be abbreviated as "PZTN" hereinafter), and the like can be used. Any one of these compound oxides can form a solid solution of A-site oxide and B-site oxide shown in the formula. Further, these compound oxides can take a perovskite crystal structure by crystallization. When the compound oxides take a perovskite crystal structure by crystallization, piezoelectricity can be exhibited. As a result, the piezoelectric layer 30 can be deformed by applying an electric field from the first conductive layer 10 and the second conductive layer 20 (electromechanical conversion). This deformation permits, for example, bending and vibration of the substrate 1.

The piezoelectric layer 30 has a thermally stimulated current having two peaks including a low temperature-side peak and a high temperature-side peak. The term "thermally stimulated current" represents a current observed in measurement of a sample in an excited state (electrons are trapped in crystal defects or the like) under heating, and is abbreviated as "TSC". TSC is generally measured as follows. First, an electric field (trapping voltage) is applied to a sample at a high temperature, and the sample is cooled with the electric field applied to freeze the electron trap state created by applying the electric field to the sample. Then, the trapping voltage is cut off, and the sample is heated at a constant heating rate. At this time, a current produced in the sample due to the release of electron traps during heating, i.e., TSC, is measured (in this case, a collecting electric field may be applied to the sample). Therefore, TSC is generally measured as a chart (may be referred to as a "TSC chart" or "TSC spectrum" hereinafter) showing plots of current (TSC) values against sample temperatures.

In addition, a peak in a TSC chart represents a concave or convex portion on the TSC chart after removal of a base line (background).

The TSC chart after removal of a base line is theoretically represented by the following expression (1):

$$I_{TSC} = n(T_0)\nu \exp\left[-\frac{E_a}{kT} - \frac{\nu}{\beta}\int_{T_0}^{T} \exp\left(\frac{E_a}{kT}\right)dT\right] \quad (1)$$

In expression (1), $I_{TSC}$ is a value of thermally stimulated current, $n(T_0)$ is a defect density, $\nu$ is escape frequency, $E_a$ is defect activation energy, k is the Boltzmann constant, T is a temperature, $\beta$ is a heating rate, and $T_0$ is a measurement start temperature. All TSC spectra shown below in the specification are spectra after removal of a background.

A low temperature-side peak in a TSC chart of crystallized PZT is frequently attributed to oxygen defects in crystals. In addition, a high temperature-side peak in a thermally stimulated current of crystallized PZT is frequently attributed to defects concerning lead in crystals. Further, each of the peaks is produced due to many defects and is considered as a collection of many micro peaks. In the present invention, the magnitudes of a low temperature-side peak appearing on the low temperature side and a high temperature-side peak appearing on the high temperature side in a TSC chart are defined regardless of these attribution examples.

When the low temperature-side peak and the high temperature-side peak are superposed in the observed TSC chart, the peaks can be separated by fitting of the peaks using the above expression (1). In the specification, the magnitude of each of the peaks represents a current value at the top of each peak after the background is removed and, if required, the peaks are separated from each other, or a peak area above the background. A peak area is related to the defect density $n(T_0)$ according to the above expression (1). Therefore, an area ratio of each peak can be referred to as a density ratio of a specified type of defects (group) in the sample.

The piezoelectric layer 30 is formed so that in a TSC chart, the magnitude of the low temperature-side peak is 1/30 or less of the magnitude of the high temperature-side peak. In the TSC chart of the piezoelectric layer 30, the magnitude of the low temperature-side peak is preferably 1/40 or less, more preferably 1/50 or less, of the magnitude of the high temperature-side peak. The piezoelectric element 100 according to this embodiment has, in the TSC chart of the piezoelectric layer 30, the above-described relation between the low temperature-side peak and the high temperature-side peak and thus has a good quantitative ratio between a defect type which produces the low temperature-side peak and a defect type which produces the high temperature-side peak. Therefore, for example, when the piezoelectric element 100 is driven, a leak current produced between the first conductive layer 10 and the second conductive layer 20 is suppressed over a long time, and a decrease in displacement of the piezoelectric element 100 is suppressed. Consequently, the piezoelectric element 100 according to this embodiment is excellent in durability.

The low temperature-side peak and the high temperature-side peak can be measured in one heating process by selecting measurement conditions for the TSC chart. In addition, the conditions for measuring only the low temperature-side peak can be determined. For example, a TSC chart is obtained under specified measurement conditions, and the approximate positions of the high, temperature-side peak and the low temperature-side peak are confirmed. Then, measurement for more clarifying only the low temperature-side peak is performed at a trapping temperature and heating rate which are different from those in the previous measurement. In this case, the low temperature-side peak can be more clearly observed, and thus the magnitude of the low temperature-side peak can be more correctly determined.

In the TSC chart of the piezoelectric layer 30 of the embodiment, the magnitude ratio between the low temperature-side peak and the high temperature-side peak is defined regardless of the measurement conditions. Namely, in at least one of a comparison between the magnitudes of both peaks observed by one heating process and then separation of peaks or the like, and a comparison between the magnitude of the high temperature-side peak observed under specified measurement conditions and the magnitude of the low temperature-side peak observed under measurement conditions different from those for the high temperature-side peak, there is the relation that the magnitude of the low temperature-side peak is 1/30 or less of the high temperature-side peak.

The magnitude of at least one of the low temperature-side peak and the high temperature-side peak may be changed by, for example, at least one of the methods of changing the composition of the firing atmosphere for the piezoelectric layer 30, changing the feed composition ratio of the piezoelectric layer 30, changing the firing temperature of the piezoelectric layer 30, performing post-firing (recovery annealing) after firing of the piezoelectric layer 30, and increasing the atmosphere pressure in the firing step (for example, 1 atm. or more and 10 atm. or less). These methods can be applied in proper combination of two or more. With respect, to the composition of the firing atmosphere for the piezoelectric layer 30, the magnitude of the low temperature-side peak tends to decrease as the oxygen partial pressure increases. In addition, when post-firing is performed, the magnitude of the low temperature-side peak tends to decrease by increasing the oxygen partial pressure in the atmosphere of post-firing. Further, with respect to the feed composition of the piezoelectric layer 30, when the lead composition is increased to be larger then than stoichiometric composition, the magnitudes of both the low temperature-side peak and the high temperature-side peak tend to decrease. These tendencies do not necessarily appear independently, but the magnitude ratio between the low temperature-side peak and the high temperature-side peak is affected by the mutual effect of many factors. Therefore, the method is appropriately selected and applied within a range in which the piezoelectric characteristics of the piezoelectric layer 30 are not impaired.

The configuration of an apparatus for TSC measurement is not limited, and a known method can be used. In the piezoelectric element 100, the first conductive layer 10 and the second conductive layer 20 can be used as a probe for applying a trapping voltage and detecting a de-trapping current (TSC) or as a contact of the probe.

In the piezoelectric element 100 according to the embodiment, as described above, the piezoelectric layer 30 is composed of the compound oxide containing at least lead, zirconium, titanium, and oxygen and having a perovskite crystal structure. In addition, the piezoelectric layer 30 has the thermally stimulated current having the two peaks including the low temperature-side peak and the high temperature-side peak, and the magnitude of the low temperature-side peak is 1/30 or less of the high temperature-side peak. Therefore, in the piezoelectric layer 30, the quantitative ratio between a defect type which produces the low temperature-side peak and a defect type which produces the high temperature-side peak is improved. Thus, in the piezoelectric layer 30, a leak current is suppressed over a long time, and a decrease in displacement is also suppressed. Consequently, the piezoelectric element 100 is excellent in durability.

2. Method for Manufacturing Piezoelectric Element

The piezoelectric element 100 according to the embodiment of the present invention can be manufactured, for example, as described below.

First, the substrate 1 is prepared, and the first conductive layer 10 is formed on the substrate 1. The first conductive layer 10 can be formed by, for example, sputtering, plating, vacuum evaporation, or the like. The first conductive layer 10 can be patterned according to demand.

Next, the piezoelectric layer 30 is formed on the first conductive layer 10. The piezoelectric layer 30 can be formed by, for example, a sol-gel method, a CVD (Chemical Vapor Deposition) method, a MOD (Metal Organic Deposition) method, a sputtering method, a laser abrasion method, or the like. For example, when the material of the piezoelectric layer 30 is PZT, the piezoelectric layer 30 can be crystallized by firing at about 650° C. to 750° C. in an oxygen atmosphere. The crystallization may be performed after patterning of the piezoelectric layer 30.

Next, the second conductive layer 20 is formed on the piezoelectric layer 30. The second conductive layer 20 can be formed by, for example, sputtering, plating, vacuum evaporation, or the like. The second conductive layer 20 and the piezoelectric layer 30 can be simultaneously patterned according to demand.

The piezoelectric element 100 can be manufactured by the above-described process.

In the above-described example of the manufacturing method, the second conductive layer 20 and the piezoelectric layer 30 may be patterned after the second conductive layer 20 is formed, and then post-firing (recovery annealing) may be performed. In this case, oxygen is more easily supplied, from the side surface of the piezoelectric layer 30 which is exposed by patterning, to the piezoelectric layer 30 covered with the second conductive layer 20 having low permeability to oxygen. As a result, the amount of oxygen detects in the piezoelectric layer 30 can be decreased.

3. Experimental Example

The present invention is described in further detail below by experimental examples. The present invention is not limited to the experimental examples described below.

Figure 2:
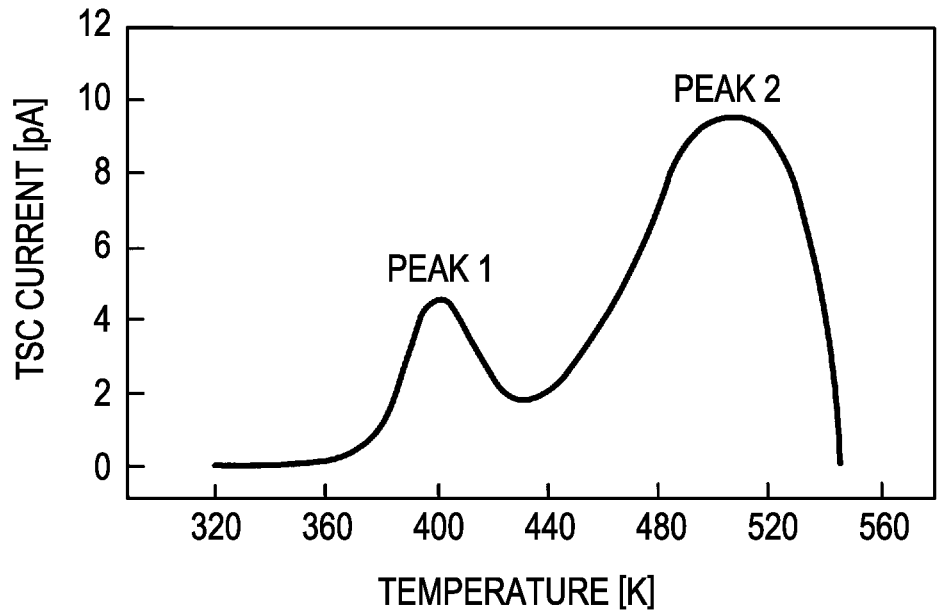
FIG. 2 is an example of a TSC chart of PZT.

The activation energy and amount of oxygen defects present in the compound oxide of the piezoelectric layer 30 can be evaluated by TSC measurement. FIG. 2 schematically shows a typical TSC spectrum of PZT. TSC spectra similar to that shown in FIG. 2 are described in, for example, Z. Wu et al., Proc. ISAF 224 (1992), etc. As described above, a peak (in FIG. 2, PEAK 1) present on the low temperature side is considered as a peak due to oxygen defects. In addition, a peak (in FIG. 2, PEAK 2) present on the high temperature side is considered as a peak due to lead (Pb) defects or $PbO_x$ composite defects. The current value at the top of the low temperature-side peak is generally about a half of the high temperature-side peak depending on the measurement conditions.

Hereinafter, several TSC charts of piezoelectric layers composed of lead zirconate titanate are described with reference to the experimental examples. In each of the experimental examples, a piezoelectric element was formed and subjected to TSC measurement. The planar outer shape of the piezoelectric element was a circular shape having a radius of 500 μm. The thickness of a piezoelectric layer was 1,320 nm. The piezoelectric layer of each of the experimental examples was formed by a known sol-gel method. A raw material solution used in the sol-gel method had an element composition ratio of Pb:Zr:Ti=1.18:0.52:0.48. In addition, the firing temperature of the piezoelectric layers was 400° C.

The piezoelectric elements of Experimental Examples 1, 2, and 3 were formed by firing in different atmospheres. In Experimental Examples 1, 2, and 3, the oxygen partial pressures in the firing atmospheres were 100%, 50%, and 25%, respectively.

TSC measurement was performed as follows. First, the piezoelectric element of each of the experimental examples was heated to a trapping temperature of 553.15 K (280° C.) from room temperature while a trapping voltage of 1 V was applied. Then, the piezoelectric element was cooled to 298.15 K (25° C.) with the trapping voltage applied. Then, the piezoelectric element was heated at a heating rate of 10 K/min with a collecting voltage of −5 mV to measure TSC. The measurement was performed using a commercial TSC measuring apparatus (manufactured by Rigaku Corporation, model TS-FETT).

Figure 3:
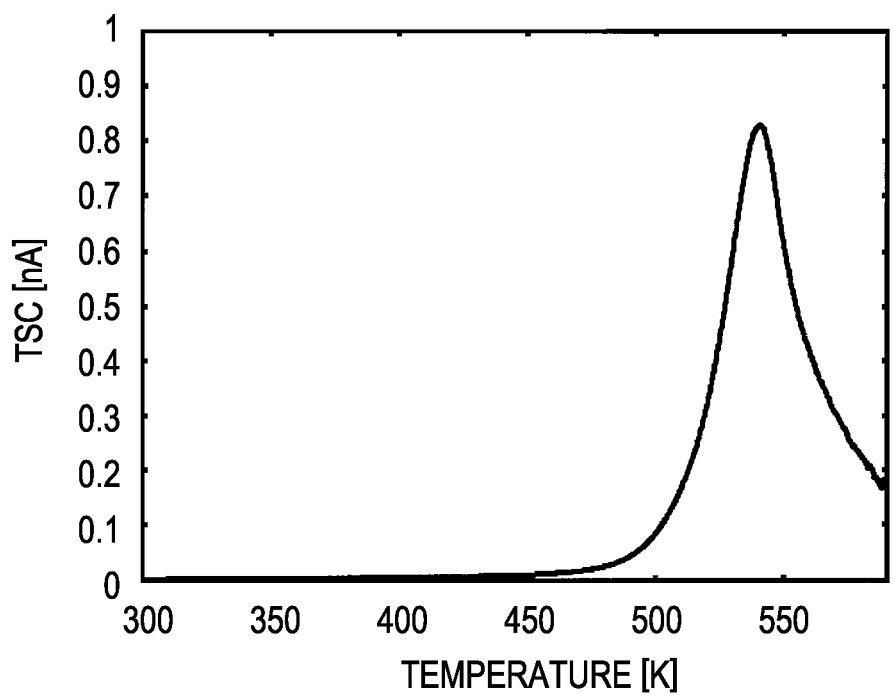
FIG. 3 is a TSC chart of a piezoelectric layer of Experimental Example 1.

FIG. 3 is a TSC chart of the piezoelectric layer of Experimental Example 1 measured under the above-described conditions. The TSC chart was obtained after removal of a background due to thermocurrent and the like and shows the thermally stimulated current (TSC) produced in the heating step at a heating rate of 10 K/min with a collecting voltage of −5 mV.

Figure 4:
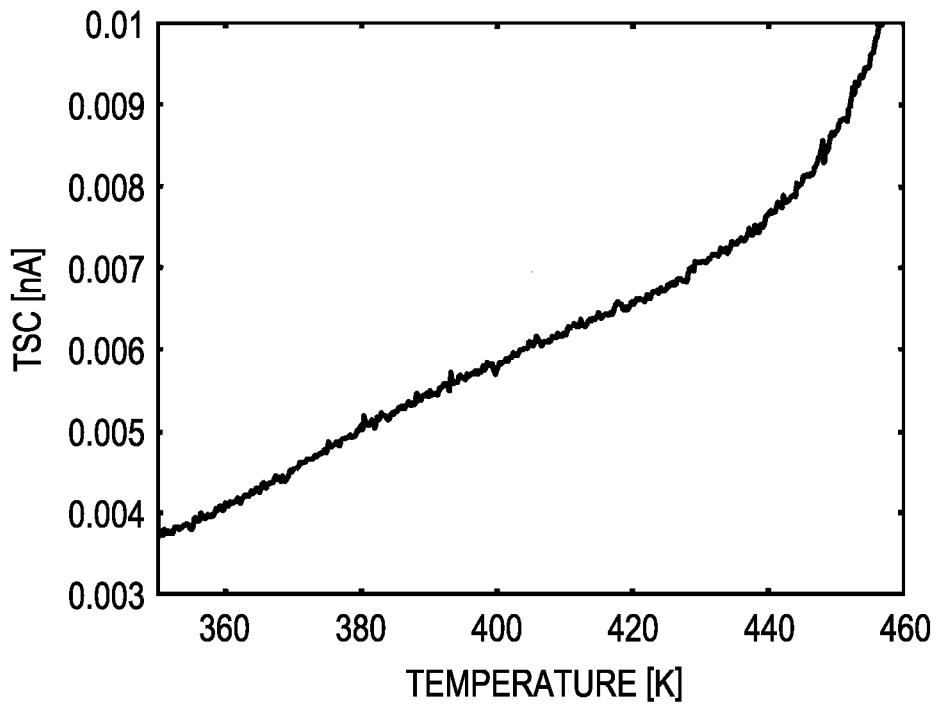
FIG. 4 is an enlargement of a TSC chart of a piezoelectric layer of Experimental Example 1.

FIG. 3 indicates that the TSC spectrum of Experimental Example 1 has a high temperature-side peak near 540 K. The current value at the peak top is about 840 pA. This spectrum also has a low temperature-side peak near 380 K to 450 K but the low temperature-side peak is very small and cannot be clearly confirmed. FIG. 4 is an enlargement of a portion of the TSC spectrum of FIG. 3. In FIG. 4, the low temperature-side peak can be confirmed.

Figure 5:
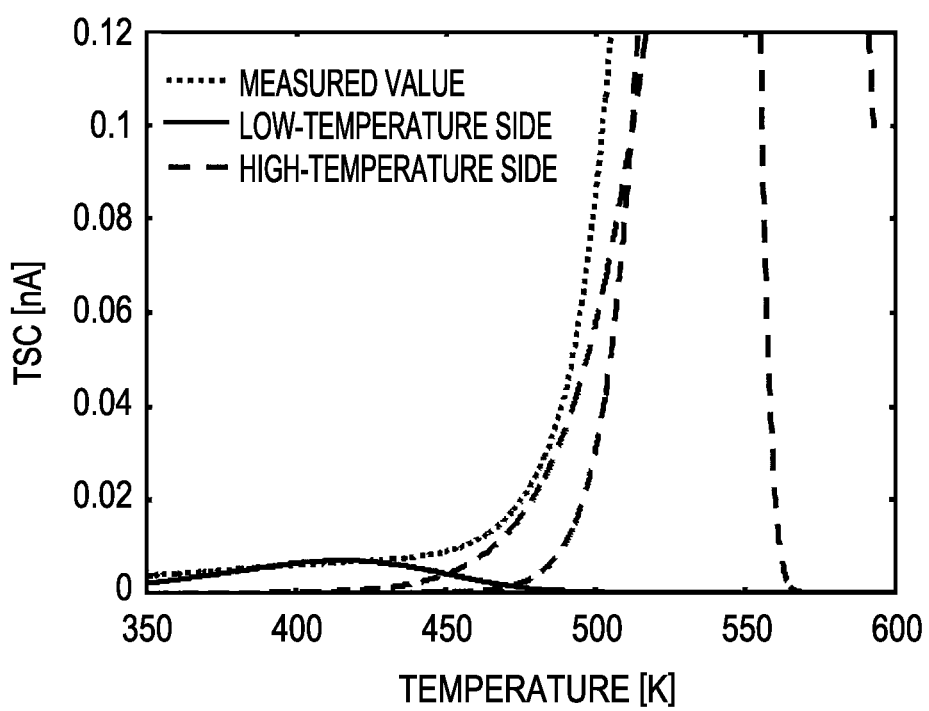
FIG. 5 is a diagram showing an example of fitting of a TSC chart of a piezoelectric layer of Experimental Example 1.

Next, fitting of the low temperature-side peak and the high temperature-side peak was made using the above-described expression (1), and the low temperature-side peak was extracted. The fitting was made under a condition in which one peak was present in a low temperature region, and two peaks were present in a high temperature region. The temperature range of the fitting was 353.15 K (80° C.) or more and 603.15 K (330° C.) or less. The results of the fitting are shown in FIG. 5.

As a result of fitting, the current value at the top of the low temperature-side peak was about 8 pA. Therefore, comparing with the current value at the top of the high temperature-side peak, it was found that the low temperature-side peak has a current value of about 1/100 of the high temperature-side peak.

In addition, the defect density of the piezoelectric layer of Experimental Example 1 can be determined according to the expression (1). As a result of the fitting, the detect density of the low temperature-side peak was $1.4 \times 10^{17}$ defects/$cm^3$, and the defect density (total of two peaks) of the high temperature-side peak was $3.5 \times 10^{18} + 5.0 \times 10^{18} = 8.5 \times 10^{18}$ defects/$cm^3$. The ratio of the defect density calculated from the high temperature-side peak to the defect density calculated from the low temperature-side peak was 8.5:0.14≠1:61. Therefore, in Experimental Example 1, the magnitude of the low temperature-side peak was 1/30 or less of the high temperature-side peak at the top of the peak and any point in the peak area.

Figure 6:
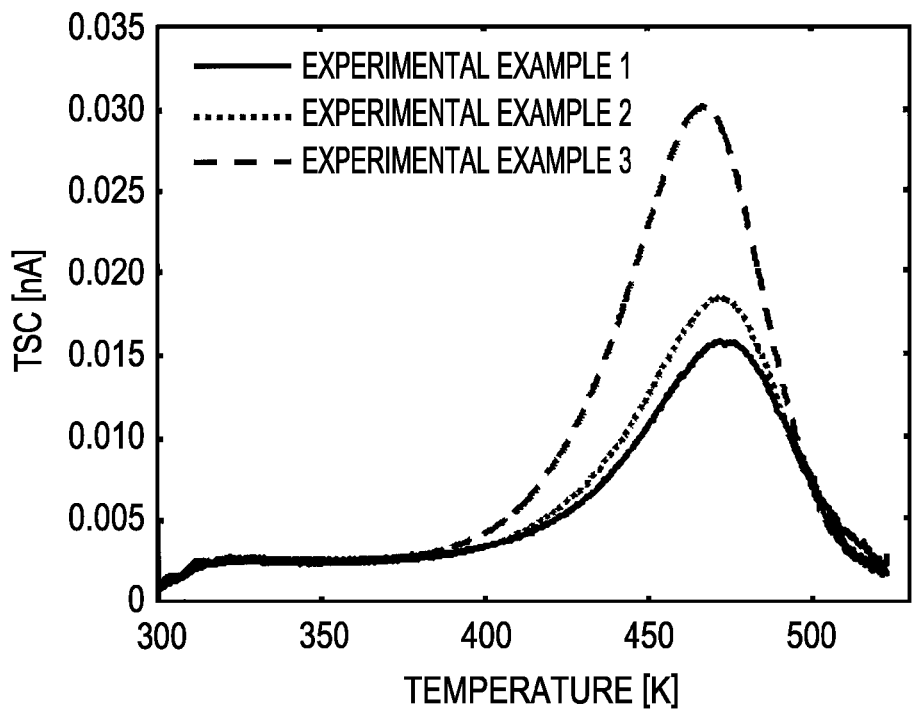
FIG. 6 is a TSC chart of a piezoelectric layer of each of experimental examples.

Further, in Experimental Example 1, the measurement conditions were changed for measuring the low temperature-side peak. As a result of measurement according to the same procedures as described above except that the trapping temperature was 423.15 K (150° C.), only the low temperature-side peak was observed as shown in FIG. 6. In a TSC spectrum of Experimental Example 1 shown in FIG. 6, the current value at the top of the peak was 15 pA, and the defect density was $1.6 \times 10^{17}$ defects/$cm^3$. In a comparison between the magnitude of the low temperature-side peak observed under these measurement conditions and the magnitude of the high temperature-side peak observed under the above-described measurement conditions, the current value of the low temperature-side peak is about 1/56 of the high temperature-side peak, and the defect density (peak area) of the low temperature-side peak is about 1/53 of the high temperature-side peak. Therefore, in the piezoelectric layer of the piezoelectric element of Experimental Example 1, both the current value and the defect density of the low temperature-side peak are 1/30 or less of those of the high temperature-side peak.

FIG. 6 also shows TSC charts of Experimental Examples 2 and 3 observed under conditions for measuring only low temperature-side peaks. In Experimental Examples 2, and 3, the current values at the tops of the low temperature-side peaks are 15 pA, 18 pA, and 30 pA, respectively. These results indicate that the low temperature-side peak of the piezoelectric element of Experimental Example 3 in which the oxygen partial pressure in firing is 25% has the greatest current amount, while Experimental Example 1 in which the oxygen partial pressure in firing is 100% has the smallest current amount. Therefore, the low temperature-side peak is considered to be closely related to oxygen defects in a perovskite crystal structure of PZT.

Figure 7:
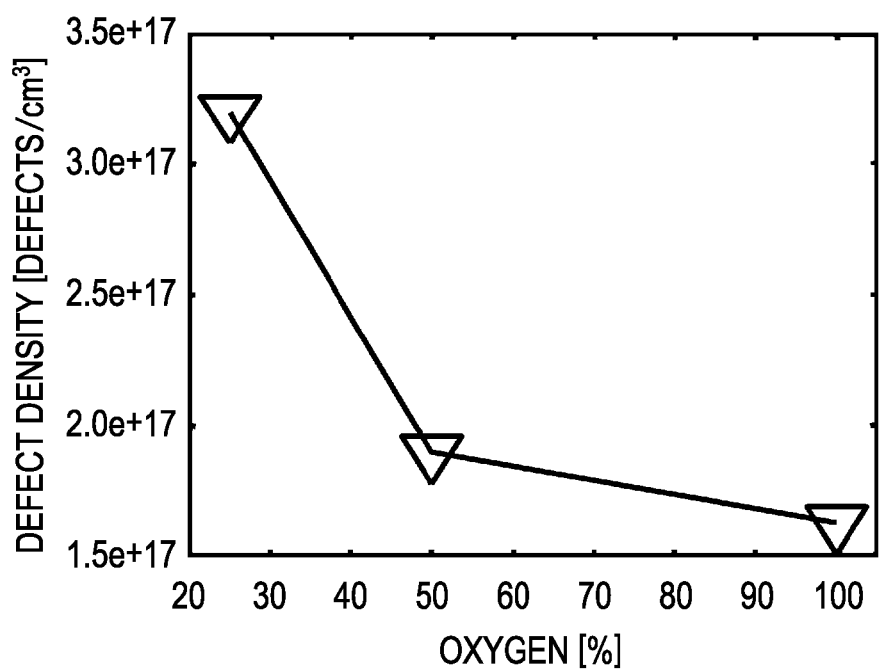
FIG. 7 is a graph showing a relation between defect density and oxygen partial pressure in firing of a piezoelectric layer of each of experimental examples.

The defect density of the low temperature-side peak of each of the experimental examples shown in FIG. 6 was determined by fitting. A baseline in fitting was set to the current value at 350° C. FIG. 7 is a graph plotting a relation between the oxygen partial pressure in firing and the density of trapped electrons (defect density). It is found that when the oxygen partial pressure in firing is lower than about 40%, the area of the low temperature-side peak increases, and the defect density increases.

Figure 8:
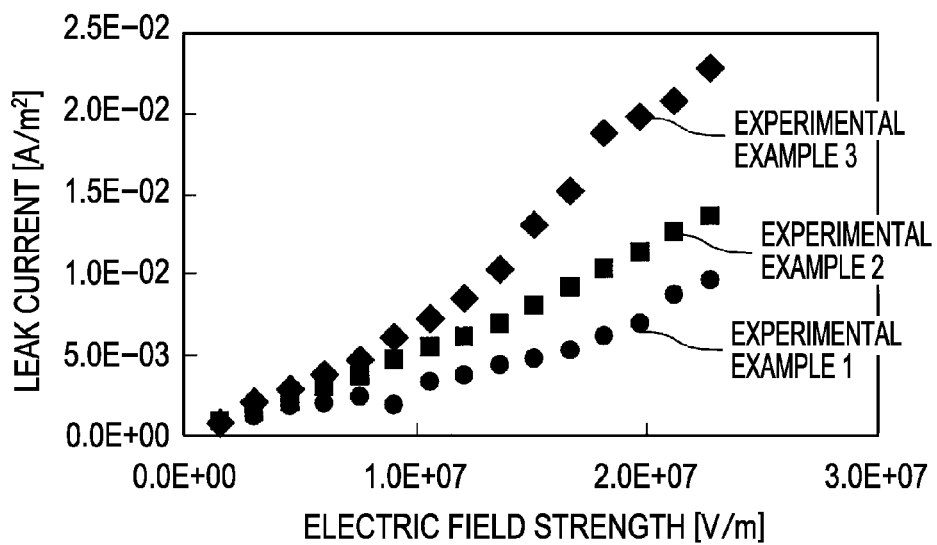
FIG. 8 is a graph showing the result of measurement of leak current of a piezoelectric layer of each of experimental examples.

FIG. 8 shows the results of measurement of a leak current of the piezoelectric element of each of the experimental examples. In Experimental Example 3, the leak current is larger than in the other experimental examples because of the low oxygen partial pressure in firing. It has been found that when a piezoelectric element is driven at a voltage of 30 V, with a leak current of 0.015 A/cm² or more, cracking easily occurs in the piezoelectric element. Therefore, it is found that in the piezoelectric elements of Experimental Examples 1 and 2 in which the oxygen partial pressure in firing was 50% or more, the leak current falls within an allowable range.

In a TSC spectrum of Experimental Example 2 shown in FIG. 7, the current value of the peak was 18 pA, and the defect density was $1.9 \times 10^{17}$ defects/cm³. In a comparison between the magnitude of the low temperature-side peak observed under these measurement conditions and the magnitude of the high temperature-side peak observed under the above-described measurement conditions, the current value of the low temperature-side peak is about 1/47 of the high temperature-side peak, and the defect density (peak area) of the low temperature-side peak is about 1/45 of the high temperature-side peak. Therefore, in the piezoelectric layer of the piezoelectric element of Experimental Example 2, both the current value and the defect density of the low temperature-side peak are 1/30 or less of those of the high temperature-side peak. While in a TSC spectrum of Experimental Example 3 shown in FIG. 7, the current value of the peak was 30 pA, and the defect density was $3.2 \times 10^{17}$ defects/cm³. In a comparison between the magnitude of the low temperature-side peak observed under these measurement conditions and the magnitude of the high temperature-side peak observed under the above-described measurement conditions, the current value of the low temperature-side peak is about 1/28 of the high temperature-side peak, and the defect density (peak area) of the low temperature-side peak is about 1/27 of the high temperature-side peak. Therefore, in the piezoelectric layer of the piezoelectric element of Experimental Example 3, both the current value and the defect density of the low temperature-side peak exceed 1/30 of those of the high temperature-side peak.

4. Liquid Ejecting Head

Figure 9:
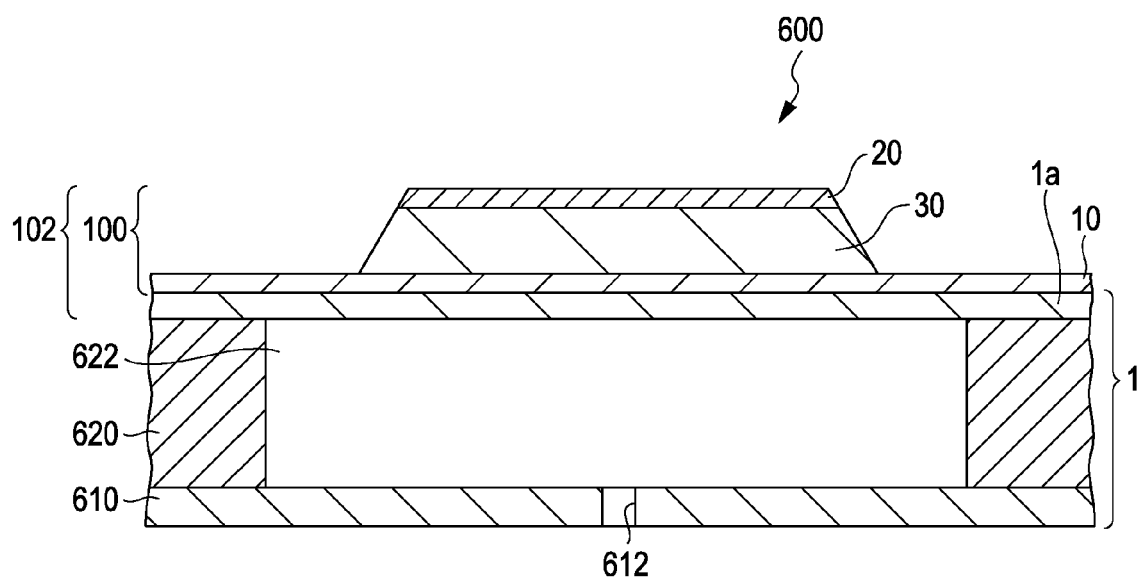
FIG. 9 is a schematic sectional view of a principal portion of a liquid ejecting head according to an embodiment of the invention.
Figure 10:
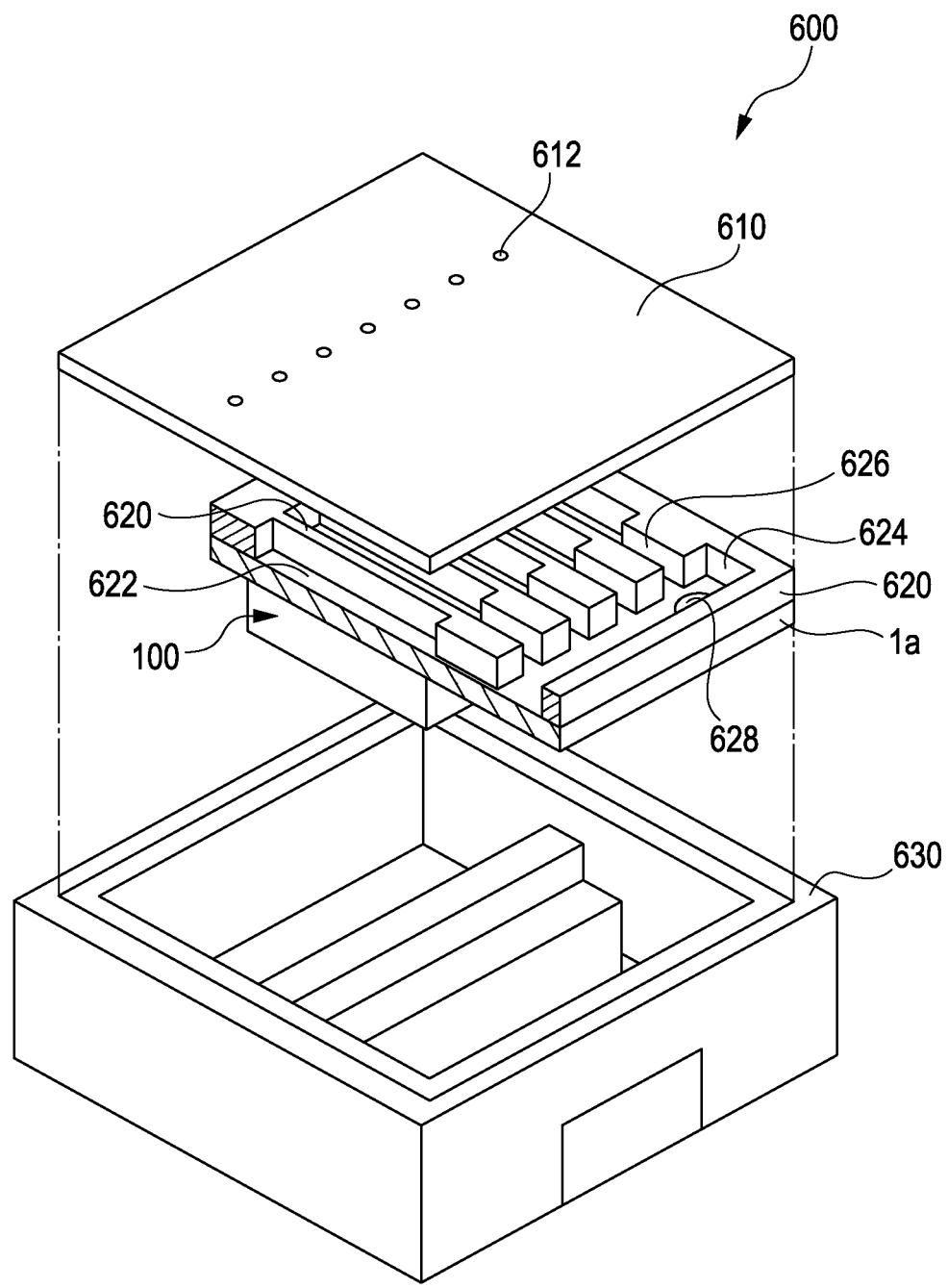
FIG. 10 is an exploded perspective view schematically showing a liquid ejecting head according to an embodiment of the invention.

Next, a liquid ejecting head 600 including the piezoelectric element according to the present invention which functions as a piezoelectric actuator is described with reference to the drawings. FIG. 9 is a schematic sectional view of a principal portion of the liquid ejecting head 600. FIG. 10 is an exploded perspective view showing the liquid ejecting head 600 in an upside-down state of normal operation.

The liquid ejecting head 600 can include the above-described piezoelectric element (piezoelectric actuator). In an example below, the liquid ejecting head 600 is described, in which the piezoelectric element 100 is formed on the substrate 1 (structure including an upper portion serving as a vibrating plate 1a) to serve as the piezoelectric actuator 102.

As shown in FIGS. 9 and 10, the liquid ejecting head 600 includes a nozzle plate 610 having nozzle orifices 612, a pressure chamber substrate 620 for forming pressure chambers 622, and the piezoelectric element 100. As shown in FIG. 10, the liquid ejecting head 600 can further include a casing 630. In FIG. 10, the piezoelectric element 100 is shown in a simplified form.

The nozzle plate 610, as shown in FIGS. 9 and 10, includes the nozzle orifices 612. An ink can be ejected from the nozzle orifices 612. In the nozzle plate 610, for example, many nozzle orifices 612 are provided in a line. As the material of the nozzle plate 610, for example, silicon, stainless steel (SUS), or the like can be used.

The pressure chamber substrate 620 is provided on the nozzle plate 610 (below the nozzle plate 610 in the example shown in FIG. 10). The material of the pressure chamber substrate 620 can be exemplified by silicon and the like. The space between the nozzle plate 610 and the vibrating plate 1a is partitioned by the pressure chamber substrate 620 to provide a reservoir (liquid storing portion) 624, supply ports 626 communicated with the reservoir 624, and the pressure chambers 622 communicated with the supply ports 626 as shown in FIG. 10. In other words, the reservoir 624, the supply ports 626, and the pressure chambers 622 are partitioned by the nozzle plate 610, the pressure chamber substrate 620, and the vibrating plate 1a. The reservoir 624 can temporarily store the ink supplied from the outside (e.g., an ink cartridge) through a through hole 628 provided in the vibrating plate 1a. The ink in the reservoir 624 can be supplied to the pressure chambers 622 through the supply ports 626. The pressure chambers 622 are changed in volume by deformation of the vibrating plate 1a. The pressure chambers 622 are communicated with the nozzle orifices 612 so that the ink or the like is ejected from the nozzle orifices 612 by changes in volume of the pressure chambers 622.

The piezoelectric element 100 is provided on the pressure chamber substrate 620 (in the example shown in FIG. 13, below the pressure chamber substrate 620). The laminated structure of the piezoelectric element 100 is electrically connected to a piezoelectric element driving circuit (not shown) so as to permit operations (vibration, deformation) on the basis of signals from the piezoelectric element driving circuit. The vibrating plate 1a is deformed by the operation of the laminated structure (the piezoelectric layer 30) so that the pressure in the pressure chambers 622 can be appropriately changed.

As shown in FIG. 10, the casing 630 can house the nozzle plate 610, the pressure chamber plate 620, and the piezoelectric element 100. As the material of the casing 630, for example, a resin, a metal, or the like can be used.

The liquid ejecting head 600 includes the piezoelectric element 100 having the piezoelectric layer 30 with a good defect ratio. Therefore, the liquid ejecting head 600 has high durability.

The case in which the liquid ejecting head 600 is an ink jet recording head is described above. However, the liquid ejecting head of the present invention can also be used as a colorant ejecting head used for producing color filters of a liquid crystal display and the like, an electrode material ejecting head used for forming electrodes of an organic EL display, FED (surface emitting display), and the like, a bio-organic ejecting head used for producing bio-chips, and the like.

5. Liquid Ejecting Apparatus

Figure 11:
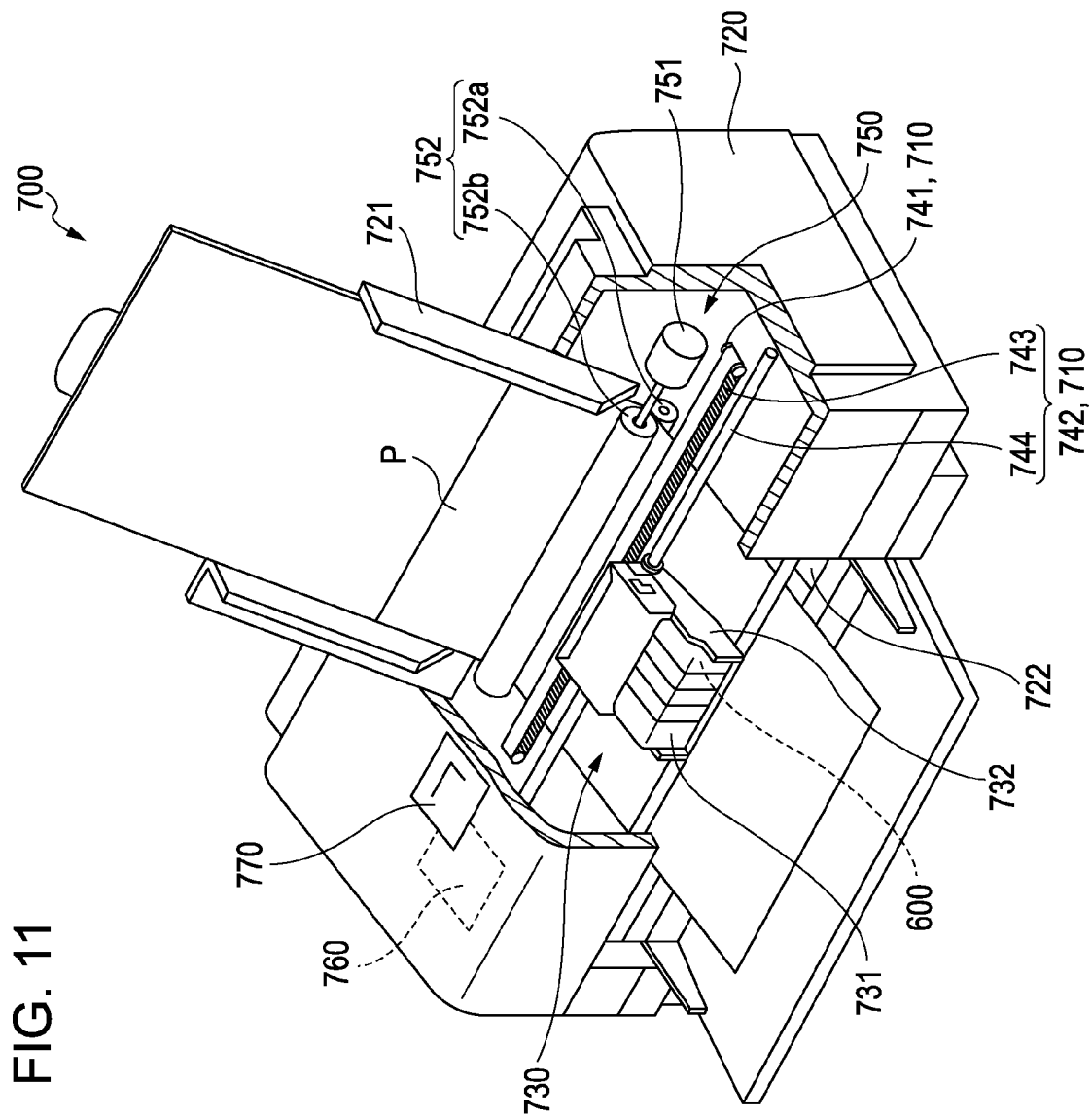
FIG. 11 is a perspective view schematically showing a liquid ejecting apparatus according to an embodiment of the invention.

Next, a liquid ejecting apparatus according to an embodiment of the present invention is described with reference to the drawing. FIG. 11 is a perspective view schematically showing a liquid ejecting apparatus 700 according to an embodiment of the invention. The liquid ejecting apparatus 700 includes the liquid ejecting head according to the present invention. Hereinafter, the case in which the liquid ejecting apparatus 700 is an ink jet printer including the above-described liquid ejecting head 600 is described.

As shown in FIG. 11, the liquid ejecting apparatus 700 includes a head unit 730, a driving portion 710, and a control portion 760. The liquid ejecting apparatus 700 may further include an apparatus body 720, a paper feed portion 750, a tray 721 on which recording paper P is placed, a discharge port 722 through which the recording paper P is discharged, and an operation panel 770 disposed on the upper surface of the apparatus body 720.

The head unit 730 includes an ink jet recording head (simply referred to as a "head" hereinafter) including the above-described liquid ejecting head 600. The head unit 730 is further provided with an ink cartridge 731 which supplies ink to the head and a carriage 732 on which the head and the ink cartridge 731 are mounted.

The driving portion 710 can reciprocate the head unit 730. The driving portion 710 includes a carriage motor 741 serving as a driving source of the head unit 730 and a reciprocating mechanism 742 which receives rotation of the carriage motor 741 to reciprocate the head unit 730.

The reciprocating mechanism 742 includes a carriage guide shaft 744 with both ends supported by a frame (not shown) and a timing belt 743 extended in parallel with the carriage guide shaft 744. The carriage guide shaft 744 supports the carriage 732 so that the carriage 732 can freely reciprocate. Further, the carriage 732 is fixed to a portion of the timing belt 743. When the timing belt 743 is traveled by operating the carriage motor 741, the head unit 730 reciprocates by being guided by the carriage guide shaft 744. During the reciprocation, ink is appropriately ejected from the head to perform printing on the recording paper P.

The control portion 760 can control the head unit 730, the driving portion 710 and the paper feed portion 750.

The paper feed portion 750 can transfer the recording paper P from the tray 721 to the head unit 730. The paper feed portion 750 includes a paper feed motor 751 serving as a driving source and a paper feed roller 752 which rotates by operation of the paper feed motor 751. The paper feed roller 752 is provided with a driven roller 752a and a driving roller 752b which are opposed to each other with a feed passage of the recording paper P provided therebetween. The driving roller 752b is connected to the paper feed motor 751. When the paper feed portion 750 is driven by the control portion 760, the recording paper P is transferred to pass below the head unit 730.

The head unit 730, the driving portion 710, the control portion 760, and the paper feed portion 750 are provided in the apparatus body 720.

The liquid ejecting apparatus 700 includes the liquid ejecting head 600 with high reliability. Therefore, the liquid ejecting apparatus 700 has high reliability.

Although the piezoelectric actuator is described as an example of the piezoelectric element according to the present invention, the piezoelectric element according to the present invention can also be used as other piezoelectric elements such as ultrasonic devices such as an ultrasonic oscillator and the like, an ultrasonic motor, a pressure sensor, and the like. In addition, although the ink jet recording apparatus 700 serving as an ink jet printer is described as an example of the liquid ejecting apparatus according to the present invention, the liquid ejecting apparatus according to the present invention can also be industrially used. In this case, as a liquid (liquid material) to be ejected, various functional materials with viscosity appropriately adjusted with a solvent or a dispersion medium can be used. Besides image recording apparatuses such as the above-described printer and the like, the liquid ejecting apparatus according to the present invention can be preferably used as a colorant ejecting apparatus used for producing color filters of a liquid crystal display and the like, a liquid material ejecting apparatus used for forming electrodes and color filters of an organic EL display, FED (surface emitting display), an electrophoretic display, and the like, a bio-organic material ejecting apparatus used for producing bio-chips, and the like.

The above-mentioned embodiment and modified examples are only examples, and the present invention is not limited to these. For example, two or more of the above-mentioned embodiment and modified examples can be appropriately combined.

The present invention is not limited to the above-mentioned embodiment, and various modifications can be made. For example, the present invention includes substantially the same configuration (for example, a configuration having the same function, method, and results or a configuration having the same object and advantage) as the configuration described in the embodiment. Also, the present invention includes a configuration in which an unessential portion of the configuration described in the embodiment is replaced by another. Further, the present invention includes a configuration in which the same operation and advantage as the configuration described in the embodiment are exhibited or the same object can be achieved. Further, the present invention includes a configuration in which a known technique is added to the configuration described in the embodiment.

What is claimed is:

1. A piezoelectric element comprising:
   a first conductive layer;
   a piezoelectric layer having a perovskite crystal structure and including a compound oxide containing lead, zirconium, titanium, and oxygen; and
   a second conductive layer,
   wherein the piezoelectric layer has a thermally stimulated current having at least two peaks including a low temperature-side peak and a high temperature-side peak; and
   the magnitude of the low temperature-side peak is $\frac{1}{30}$ or less of that of the high temperature-side peak.

2. The piezoelectric element according to claim 1, wherein the compound oxide is lead zirconate titanate or lead zirconate titanate niobate.

3. The piezoelectric element according to claim 1, wherein the thickness of the piezoelectric layer is 100 nm or more and 2,000 nm or less.

4. A liquid ejecting head comprising:
   a piezoelectric element including:
     a first conductive layer;
     a piezoelectric layer having a perovskite crystal structure and including a compound oxide containing lead, zirconium, titanium, and oxygen; and
     a second conductive layer,
   wherein:
   the piezoelectric layer has a thermally stimulated current having at least two peaks including a low temperature-side peak and a high temperature-side peak; and
   the magnitude of the low temperature-side peak is $\frac{1}{30}$ or less of that of the high temperature-side peak.

5. The liquid ejecting head according to claim 4, wherein the compound oxide is lead zirconate titanate or lead zirconate titanate niobate.

6. The liquid ejecting head according to claim 4, wherein the thickness of the piezoelectric layer is 100 nm or more and 2,000 nm or less.

7. A liquid ejecting apparatus comprising:
   a liquid ejecting head that includes a piezoelectric element, the piezoelectric element including:
     a first conductive layer;

a piezoelectric layer having a perovskite crystal structure and including a compound oxide containing lead, zirconium, titanium, and oxygen; and a second conductive layer, wherein:

the piezoelectric layer has a thermally stimulated current having at least two peaks including a low temperature-side peak and a high temperature-side peak; and the magnitude of the low temperature-side peak is $1/30$ or less of that of the high temperature-side peak.

8. The liquid ejecting apparatus according to claim 7, wherein the compound oxide is lead zirconate titanate or lead zirconate titanate niobate.

9. The liquid ejecting apparatus according to claim 7, wherein the thickness of the piezoelectric layer is 100 nm or more and 2,000 nm or less.

* * * * *